(12) United States Patent
Blendin et al.

(10) Patent No.: US 8,889,536 B2
(45) Date of Patent: Nov. 18, 2014

(54) METHOD FOR FORMING A DOPANT PROFILE

(75) Inventors: Gabriele Blendin, Gelnhausen (DE); Joerg Horzel, Freiburg (DE); Agata Lachowicz, Karlstein (DE); Berthold Schum, Beibergemuend (DE)

(73) Assignee: Schott Solar AG, Mainz (DE)

( * ) Notice: Subject to any disclaimer, the term of this patent is extended or adjusted under 35 U.S.C. 154(b) by 87 days.

(21) Appl. No.: 13/819,956

(22) PCT Filed: Aug. 30, 2011

(86) PCT No.: PCT/EP2011/064851
§ 371 (c)(1),
(2), (4) Date: Jul. 12, 2013

(87) PCT Pub. No.: WO2012/028593
PCT Pub. Date: Mar. 8, 2012

(65) Prior Publication Data
US 2013/0280898 A1    Oct. 24, 2013

(30) Foreign Application Priority Data

Aug. 30, 2010  (DE) .................. 10 2010 037 238
Sep. 3, 2010   (DE) .................. 10 2010 037 321
Jul. 6, 2011   (DE) .................. 10 2011 051 606

(51) Int. Cl.
| | | |
|---|---|---|
| *H01L 21/22* | (2006.01) | |
| *H01L 21/38* | (2006.01) | |
| *H01L 21/225* | (2006.01) | |
| *H01L 31/103* | (2006.01) | |
| *H01L 31/18* | (2006.01) | |
| *H01L 31/02* | (2006.01) | |
| *H01L 33/08* | (2010.01) | |

(52) U.S. Cl.
CPC .............. *H01L 21/22* (2013.01); *H01L 31/103* (2013.01); *H01L 31/186* (2013.01); *H01L 31/02* (2013.01); *H01L 31/1864* (2013.01); *H01L 33/08* (2013.01); *H01L 21/2252* (2013.01); *H01L 31/1804* (2013.01); *Y02E 10/547* (2013.01)
USPC .......................... 438/549; 257/461; 257/463

(58) Field of Classification Search
CPC ..... H01L 31/02; H01L 31/186; H01L 31/103; H01L 31/1864; H01L 33/08
USPC .................. 438/549; 257/461, 463
See application file for complete search history.

(56) References Cited

FOREIGN PATENT DOCUMENTS
WO    2010066626 A2    6/2010

OTHER PUBLICATIONS

Weiss M., et al., "Selective Emitter from structured diffusion source proves its capability of industrial realization", 24th European Photovoltaic Solar Energy Conference, Proceedings of the 24th International Conference, Wip-Renewable Energies, Sep. 21, 2009, Seiten pp. 1941-1944, 4 pp.

(Continued)

*Primary Examiner* — Karen Kusumakar
(74) *Attorney, Agent, or Firm* — Ohlandt, Greeley, Ruggiero & Perle, LLP

(57) ABSTRACT

A method is provided for forming a dopant profile based on a surface of a wafer-like semiconductor component with phosphorus as a dopant. The method includes the steps of applying a phosphorus dopant source onto the surface, forming a first dopant profile with the dopant source that is present on the surface, removing the dopant source, and forming a second dopant profile that has a greater depth in comparison to the first dopant profile. In order to form an optimized dopant profile, the dopant source is removed after forming the first dopant profile, and precipitates that are crystallized selectively on or in the surface from the precipitates $Si_xP_y$ and $Si_xP_yO_z$ are removed.

20 Claims, 6 Drawing Sheets

(56) References Cited

OTHER PUBLICATIONS

Dastgheib-Shirazi., "Selective Emitter for Industrial Solar Cell Production: A Wet Chemical Approach using a Single Side Diffusion Process", 23rd European Photovoltaic Solar Energy Conference and Exhibition, Aug. 5, 2008, pp. 1-3, 3 pp.

Nguyen V., et al. "Analysis of Screen Printed Silicon Solar Cell Emitters", 24th European Photovoltaic Solar Energy Conference, Proceedings of the 24th International Conference, Wip-Renewable Energies, Sep. 21, 2009, pp. 1923-1925, 3 pp.

Jansens T., et al. "Advanced Phosphorus Emitters for High Efficiency Si Solar Cells", Photovoltaic Specialists Conference(PVSC), Jun. 7, 2009, pp. 872-882, 5 pp.

Bazer-Bachi B., et al. "Control of Phosphorus diffusion using LYDOP technology for obtaining various phosphorous emitters" The Compiled State-of-the Art of PV Solar Technology and Deployment: 23rd European Photovoltaic Solar Energy Conference, Proceedings of the International Conference, Wip-Renewable Energies, Sep. 1, 2008, 1793-1796, 4 pp.

Kagilik A., et al. "Emitter Optimization of MC-Silicon solar cells by using dry etching technique" 19th European Photovoltaic Solar Energy Conference, Jun. 7, 2004, pp. 636-639, 4 pp.

International Search Report dated Nov. 23, 2011 corresponding to PCT/EP2011/064851, 4 pp.

Written Opinion of the International Searching Authority dated Nov. 23, 2011 corresponding to PCT/EP2011/064851, 5 pp.

SEM micrograph of a monocrystalline silicon substrate, p-type (B), after diffusion and removal of phosphosilicate glass Depth profile of the phosphorus concentration in a silicon wafer after the 1st temperature step (formation of the first dopant profile)

SEM micrograph of the same silicon substrate as Fig. 1 after additional cleaning in alkaline sodium hypochlorite solution, temperature 40 ºC, contact time 1 minute.

METHOD FOR FORMING A DOPANT PROFILE

CROSS REFERENCE TO RELATED APPLICATIONS

This application is a National Stage Entry of International Application No. PCT/EP2011/06481 filed on Aug. 30, 2011, which claims the benefit of German Patent Application No. 10 2010 037 238.2 filed on Aug. 30, 2010, German Patent Application No. 10 2010 037 321.4 filed on Sep. 3, 2010, and German Patent Application No. 10 2011 051 606.9 filed on Jul. 6, 2011, the contents of all of which are incorporated in their entirety by reference herein.

BACKGROUND OF THE INVENTION

1. Field of the Invention

The invention relates to a method for forming a dopant profile proceeding from a surface of a plate-shaped or wafer-shaped silicon-based semiconductor device made of silicon with phosphorus as a dopant, by applying a phosphorus dopant source onto the surface, forming a first dopant profile with the dopant source present on the surface, removing the dopant source and forming a second dopant profile having a greater depth in comparison to the first dopant profile.

2. Description of Related Art

For the production of a highly doped surface region of a semiconductor device comprising p-silicon, in order to form an emitter in a solar cell and simultaneously to make possible a good contacting, according to the prior art, a phosphorus source can be applied in order to propel phosphorus from this source into the semiconductor. In this case, with a high dopant concentration of phosphorus, $Si_xP_y$ precipitates are usually formed in the silicon surface. The high dopant concentrations, however, according to general opinion, are necessary in order to produce emitters that are sufficiently deep ($\geq 0.2$ μm deep) in methods that are suitable for the mass production of silicon solar cells, emitters that simultaneously have a sufficient surface concentration of phosphorus, which permits the use of Ag pastes for forming contacts. Usually, the dopant is driven in during a temperature (T)-time (t) treatment step.

Advantageously, a method can be used in which the dopant is driven in during two T-t treatment steps, the diffusion source optionally being removed after the first T-t step (WO-A-2010/066626).

Removal of the dopant source after the first diffusion step means that dopant that is still present as well as phosphosilicate glass forming during the temperature treatment are removed.

In the course of the typical diffusion method, a phase of the composition $Si_xP_y$ or $Si_x,P_yO_z$, is produced which can crystallize out in the form of orientation-dependent needles (see FIG. 1) in the highly doped Si layer in the vicinity of the surface. These precipitates have a very small conductivity, can lead to the recombination of charge carriers, produce crystal lattice disruptions in the Si crystal, and can lead to mechanical stresses in the Si surface, which can adversely affect the electrical properties of the semiconductor device.

In order to be able to produce solar cells with lower surface concentrations for highly efficient designs on thin wafers, it is important to use a cost-effective process, such as an in-line process with liquid phosphorus sources as the dopant source for the diffusion step, which does not produce precipitates in the surface of the wafer.

Phases of the composition $Si_xP_y$ or $Si_x,P_yO_z$ or the precipitates cannot be removed by HF solutions, as are usually employed for removing the phosphosilicate glass layer after diffusion.

SUMMARY

The object of the present invention is to further develop a method of the type named initially so that an optimized dopant profile can be formed on a silicon semiconductor material, in particular specific for the production of a solar cell.

The object is essentially achieved according to the invention in that, after forming the first dopant profile, the dopant source is removed and phases of the composition $Si_xP_y$ or $Si_xP_yO_z$ or the precipitates that are formed by crystallizing out from these phases that are formed during the formation of the first dopant profile are selectively removed. Here, selectively means that only the corresponding phases or precipitates are removed. Selective removal means here that the regularly diffused, approximately 100-nm deep emitter layer is not etched. The selective removal of the $Si_xP_y$ or $Si_xP_yO_z$ phases or the precipitates in this case should include the removal of electrically inactive phosphorus and free phosphorus.

The invention is particularly characterized by a method for forming a dopant profile proceeding from a surface of a plate-shaped or wafer-shaped silicon-based semiconductor component with phosphorus as a dopant, by applying a phosphorus dopant source on the surface, forming a first dopant profile with the dopant source present on the surface, removing the dopant source, and forming a second dopant profile having a greater depth in comparison to the first dopant profile, in that, after forming the first dopant profile, the dopant source is removed and $Si_xP_y$ phases present on the surface, electrically inactive phosphorus and free phosphorus, thus phosphorus that is not incorporated in the Si crystal lattice, are removed, whereby subsequently, the second temperature treatment step is conducted to form the final (second) doping profile, without precipitates being formed on the surface.

DETAILED DESCRIPTION

Figure 1:
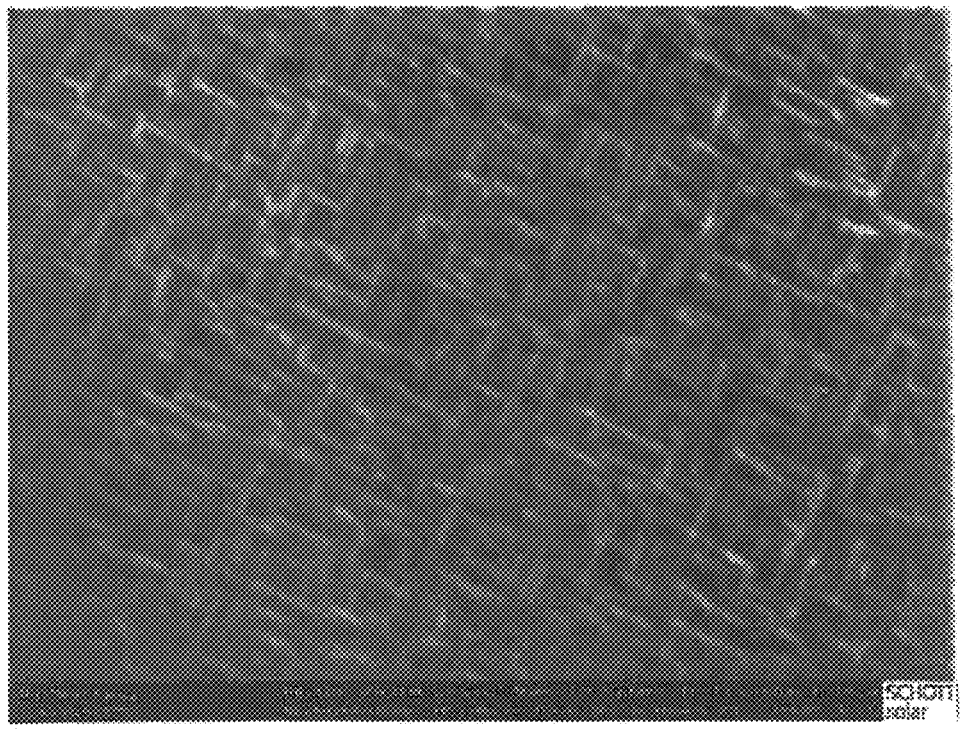
FIG. 1 a photomicrograph of a monocrystalline silicon substrate (p-type) after removal of phosphosilicate glass, FIG. 2 a representation of the phosphorus profile after the $1^{st}$ temperature step ($1^{st}$ dopant profile), measured by SIMS (secondary ion mass spectrometer), FIG. 3 a basic diagram of a monocrystalline Si wafer after the first temperature step, FIG. 4 another basic diagram of a monocrystalline Si wafer, FIG. 5 a scanning electron micrograph of the silicon substrate taken from FIG. 1 after removal of the precipitates in alkaline sodium hypochlorite solution at a temperature of 40° C. and a contact time of 1 min, and FIG. 6 a representation of a phosphorus profile measured by SIMS, which was produced by the optimized process for avoiding precipitates, after the $2^{nd}$ temperature step ($2^{nd}$ dopant profile).

Selective removal of $Si_xP_y$ or $Si_xP_yO_z$ phases or the precipitates and the removal of the electrically inactive phosphorus and the free phosphorus can be carried out simultaneously or occur simultaneously. The feature "selective" is to be interpreted in this respect.

Here, free phosphorus is phosphorus that is not incorporated in the Si crystal lattice of the semiconductor device.

Any form of the phase, precipitates in particular, are to be understood as the $Si_xP_y$ phase, which also includes $Si_xP_yO_z$.

Optionally and simultaneously, in the region of the wafer lying in the vicinity of the surface, a fraction of the excess phosphorus in the semiconductor device as well as the wafer can also be removed.

In the vicinity means up to a maximum of 10 nm. The invention comprises this etching of the region in the vicinity of the surface in this respect.

According to the invention, a two-step diffusion process, which is known in and of itself, for producing a layer doped with phosphorus from silicon wafers that are required for the production of solar cells based on silicon wafers is extensively further developed, in that after the first diffusion step, $Si_xP_y$ and $Si_xP_yO_z$ (SIP compounds), electrically inactive phosphorus and phosphorus not incorporated in the Si crystal lattice are removed. It is particularly provided that the selective removal of the precipitates is conducted by application of an alkaline etching solution that contains an oxidizing agent, whereby the alkaline etching solution contacts the surface during a time $t_3$ of 15 sec$\leq t_3 \leq$5 min, in particular 30 sec$\leq t_3 \leq$60 sec, at a temperature $T_3$ of RT (room temperature)$\leq T_3 \leq$60° C., preferably 35° C.$\leq T_3 \leq$45° C.

Independently therefrom, the invention provides that, for forming the first dopant profile, the semiconductor device is subjected to a temperature $T_1$ of $T_1 \geq$750° C. during a time $t_1$, during which a phosphorus concentration K of K$\geq 10^{20}$ phosphorus atoms/cm$^3$ arises on the surface in the surface layer of the semiconductor device in a thickness region D of 150 nm$\geq$D$\geq$20 nm, and that for forming the second dopant profile, the semiconductor device is subjected to a temperature $T_2$ during a time $t_2$, whereby $t_2 > t_1$. It is particularly provided that the temperature $T_2 \geq T_1$, in particular $T_2$ is approximately $T_1$, whereby 750° C.$\leq T_1$, $T_2 \leq$1000° C., in particular 800° C.$\leq T_1$, $T_2 \leq$900° C.

The phosphorus concentration in the surface region then has a concentration K$\leq 5*10^{20}$ phosphorus atoms/cm$^3$ proceeding down to a depth of 20 nm from the surface.

The thickness $D_0$ of the region in which the phosphorus concentration can be greater than $10^{20}$ at/cm$^3$, in particular more than $5*10^{20}$ at/cm$^3$, i.e., greater than the solubility of the phosphorus in the silicon with the applied temperatures, lies between 0 nm and 50 nm. The phosphorus not dissolved in the silicon is found in the SiP phases and in the precipitates.

Further, the first dopant profile should be formed during a time $t_1$ of 0.5 min$\leq t_1 \leq$10 min, in particular 1 min$\leq t_1 \leq$5 min, and the second dopant profile should be formed during a time $t_2$ of 10 min$\leq t_2 \leq$180 min, in particular 20 min$\leq t_2 \leq$80 min.

The possibility also exists, in particular, of conducting this process only selectively on parts of the wafer surface. For this, the regions on which the precipitates will be avoided, can be printed with an appropriate etching paste. The etching pastes can be made up corresponding to the etching solutions being employed.

In particular, it is also provided that after forming the first dopant profile and removing the dopant source, an etch-resistant mask is applied on the surface, this mask having a geometry that corresponds to that of a metallizing to be applied on the surface.

The diffusion of phosphorus can occur in different ways. For example, $POCl_3$ can be used as the P source and the process can be run as a batch process. An in-line method may also be used, however.

In this in-line method, different P sources can be used, e.g., $H_3PO_4$ dissolved in solvent or in water, which can be introduced by a spin-on, spray, fogging or dipping unit. After introducing the phosphorus source, the silicon wafers are subjected to a first T (temperature)-t (time) profile in a tunnel oven. The T-t profile is designed so that the phosphorus partially diffuses into the silicon. A phosphosilicate glass layer (PSG) is formed on the surface by reaction with oxygen.

Figure 2:
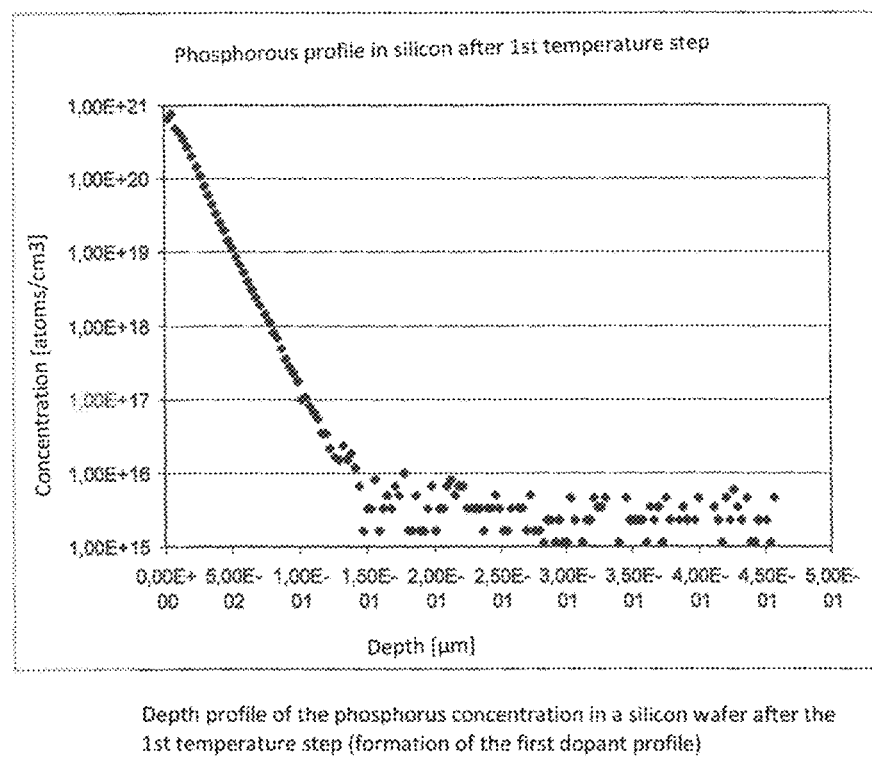

In this first high-temperature step, a flat, i.e., not deeply entrained, phosphorus profile is produced. The depth of this profile is on the order of magnitude of 100 nm. In FIG. 2, a corresponding first dopant profile is presented in the form of a phosphorus profile in silicon after the first heat treatment, the substrate having been subjected to a temperature of 870° C. during a time of 2 min.

Such a profile can also be produced with a POCl3 diffusion process, in which precipitates can also be formed with appropriate gas guidance.

Figure 3:
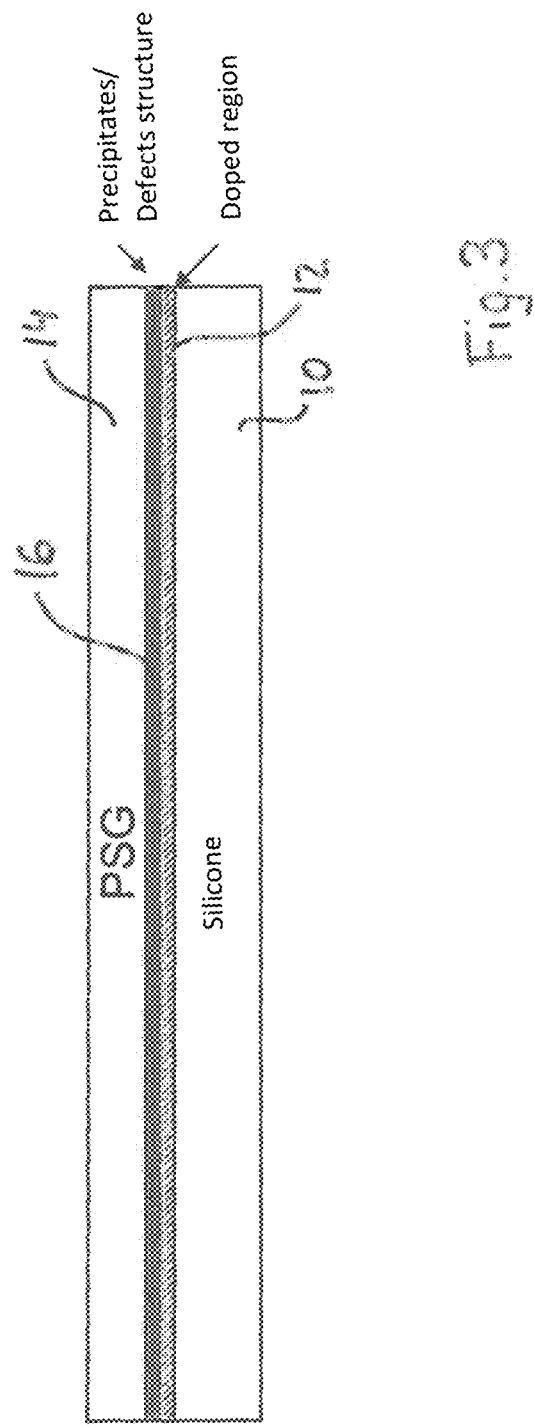

In this first diffusion step, with very high phosphorus concentrations, which are particularly necessary in in-line methods, a phase of the composition $Si_xP_y$ or $Si_xP_yO_z$ is formed at the interface of the silicon wafer to the PSG, this phase being able to crystallize out in the form of needle-shaped precipitates in the further course of the diffusion. This is illustrated in principle based on FIG. 3. Thus, a cross section of a wafer 10 composed of silicon is shown in a basic diagram, on which an n-region 12 arising due to the phosphorus that diffuses in is formed in the surface region by applying a dopant source containing phosphorus. This region 12 is covered by a phosphosilicate glass layer 14. It is further shown in principle that in the interface region between the Si wafer, i.e., the doped region 12, and the phosphosilicate glass 14, precipitates 16 of the $Si_xP_y$ or $Si_xP_yO_z$ phase have formed, which form a defect structure.

The precipitates that have crystallized out are more poorly conductive by orders of magnitude than regularly diffused regions; they cannot be etched away with the usual etching mixtures for removing PSG, and they can cause additional disruptions and dislocations in crystal zones lying thereunder. The SiP compounds in the Si lattice produce dislocations and stresses due to different lattice constants. These defects reduce the quality of semiconductor devices such as solar cells.

Figure 4:
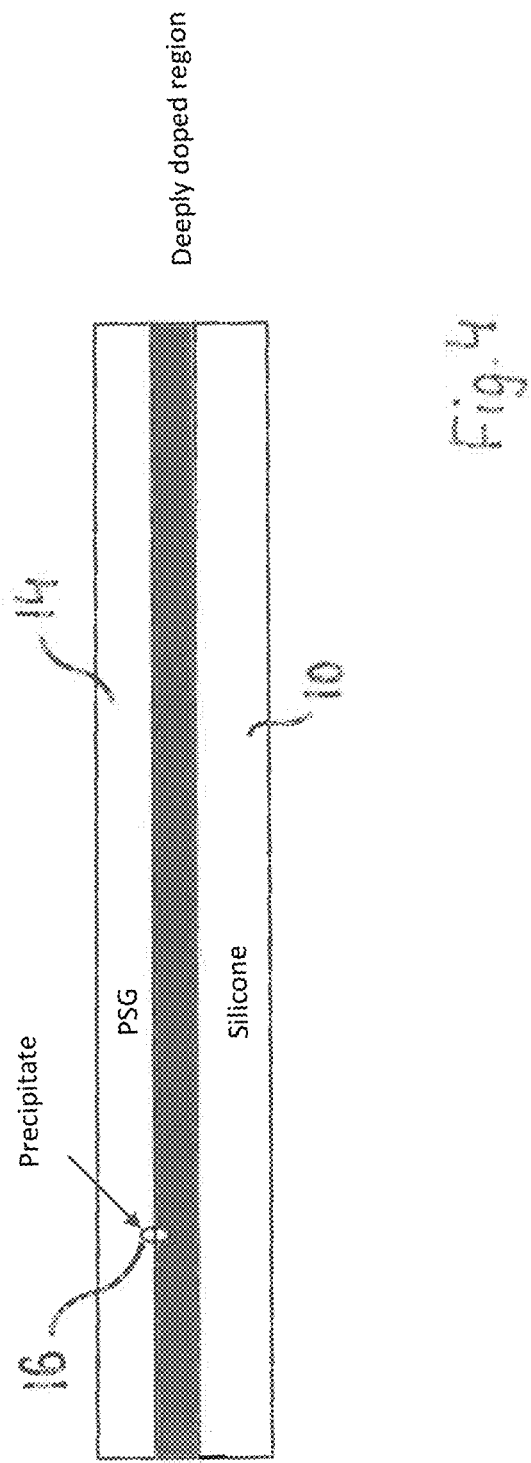

FIG. 4, which illustrates the prior art in principle, shows that precipitates 16 are crystallized out at the surface of the n-doped region 12 of a wafer 10 treated according to a standard process. This crystallizing out can be observed after a long diffusion time (e.g., more than 10 min) with a high P concentration on the surface of the wafer in the form of SiP compounds, which are clearly visible with the (scanning electron microscope) SEM.

They form rods on the surface with the dimensions: width 10-20 nm, length 100-200 nm. The size and frequency of these precipitates depends on the P concentration and the diffusion time.

After the first high-temperature step with a highly concentrated P source (phosphorus is always present in excess during the temperature step), the PSG is dissolved and the $Si_xP_y$ or $Si_xP_yO_z$ phase as well as the electrically inactive phosphorus and phosphorus not incorporated in the Si crystal lattice are removed according to the invention, essentially without etching the regularly diffused, approximately 100 nm deep emitter layer of the substrate such as the wafer. The etching step is thus conducted so that the concentration of the phosphorus in the surface region of the wafer basically corresponds to the value of the solubility of phosphorus in silicon, i.e., $5*10^{20}$ at/cm$^3$ or is smaller. In this way, it is assured that precipitates can no longer be formed in the course of the further diffusion.

Optionally, a layer of the substrate that is in the vicinity of the surface, thus the emitter layer in particular, can be etched during the etching of the precipitates. This region usually amounts to a maximum of 20 nm. This etching of the region in the vicinity of the surface is thus to be subsumed under the teaching according to the invention.

In addition, it should be pointed out that basically the dopant source or the PSG is removed prior to etching the precipitates. Usually an HF solution is used for this.

The removal of the PSG as well as the SiP compounds, of the electrically inactive phosphorus and of phosphorus which is not incorporated in the Si crystal lattice, as well as possible excess phosphorus in the surface can only be carried out on specific regions of the emitter surface, i.e., selectively. For this, after the first temperature step, an etch-resistant mask must be applied in the same shape as the metallizing grid. After this, also in these wafers, the PSG and the SiP compounds, as well as possibly a part of the highly doped layer are removed, but only in the intermediate regions, in which no metal contacts will be applied.

In addition, it is possible to selectively diffuse into these wafers with PSG on the surface employing the laser and only then to conduct the etching step or cleaning step.

If a selective removal of the phosphosilicate glass as well as of the precipitates and thus also of the inactive phosphorus and of the phosphorus not incorporated in the Si crystal lattice is to be produced, thus a removal, which is produced only in regions on the front side or front face of the semiconductor device such as a wafer of a solar cell, a masking can be utilized. The possibility also exists of conducting the etching step for the removal of the $Si_xP_y$ compounds, of the inactive phosphorus, as well as of the free phosphorus by means of an etching paste, which is selectively applied on the regions to be etched.

The phase of the composition $Si_xP_y$ or $Si_x$, $P_yO_z$ or the precipitates as well as the electrically inactive phosphorus and the phosphorus not incorporated in the Si crystal lattice are selectively removed after the first diffusion step, preferably in a wet chemical manner, by dipping in an aqueous alkaline solution that contains an oxidizing agent.

Preferably, a component from the group of NaOH, KOH is used as the alkaline component for the aqueous alkaline solution. Preferably, a component from the group of sodium hypochlorite, sodium peroxodisulfate, hydrogen peroxide, can be named as the oxidizing agent.

Figure 5:
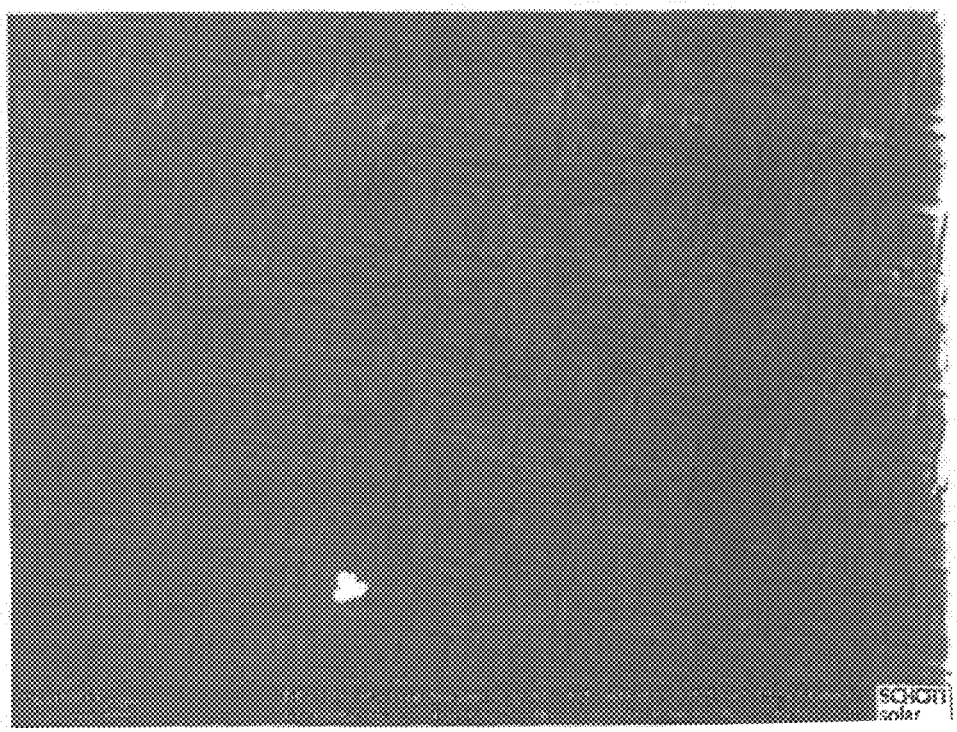

If one applies an appropriate aqueous alkaline solution containing an oxidizing agent during a contact time between 5 sec and 5 min, preferably 30 sec to 60 sec, at a temperature between 20° C. and 60° C., in particular between 35° C. and 45° C., then the precipitates will be selectively removed. This is expressed by grooves, as can be derived from FIG. 5, which reproduces an x-ray electron micrograph of a silicon substrate, which corresponds to that of FIG. 1. By the selective removal, the regularly diffused, approximately 100-nm thick emitter layer will not be etched. Selective is to be understood in this sense.

After the selective removal of the precipitates has been produced, essentially without etching the highly doped surface layer, the semiconductor device or substrate is subjected to another T-t treatment step without re-introducing a phosphorus source. In this case, the time within which the second diffusion profile is formed, is clearly longer than that for forming the first dopant profile.

During the second treatment step, the phosphorus that has already diffused into the substrate in the first process step diffuses deeper into the semiconductor substrate, so that the second phosphorus doping profile is formed, without, however, the occurrence of disruptive $Si_xP_y$ compounds or $Si_xP_yO_z$ compounds and the precipitates that crystallize out from these.

The second dopant profile can have a small surface concentration and a very large penetration depth, depending on the time and the temperature.

Figure 6:
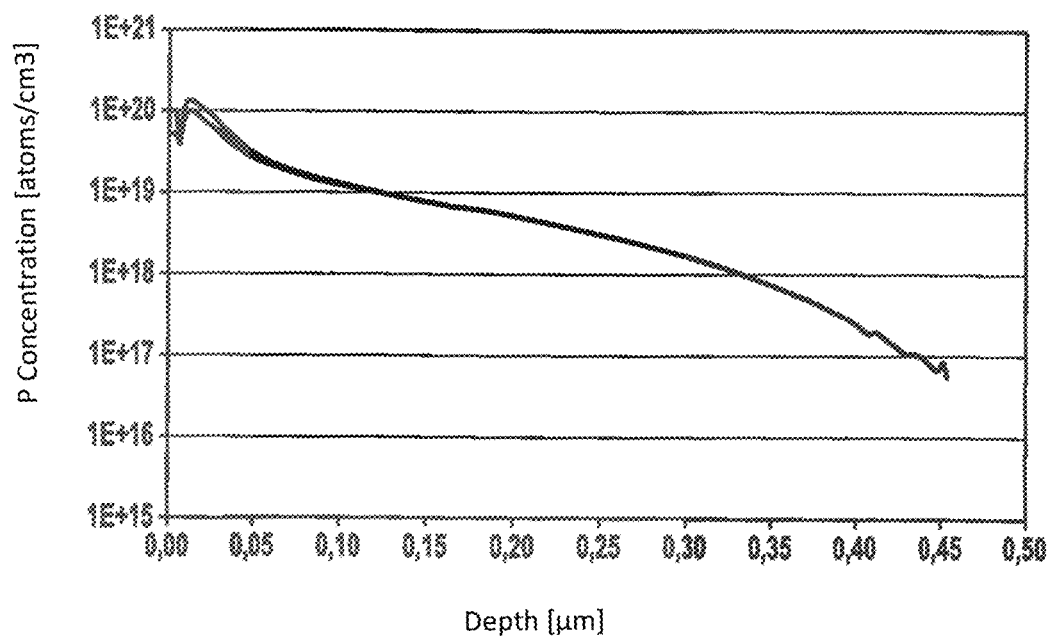

This can be derived from FIG. 6, which shows a second dopant profile in the form of a phosphorus concentration after the second temperature step. The temperature reached for the application was 830° C. The time during which the temperature acted on the wafer amounted to 60 min.

For the selective removal of the precipitates, an alkaline etching solution containing at least one oxidizing agent from the group of peroxodisulfates, peroxomonosulfates, hypochlorite, hydrogen peroxide can be used, sodium hypochlorite and sodium peroxodisulfate being named, in particular. At least one component from the group of NaOH, KOH, ammonia, ammonia derivatives, alkylamines, alkanolamines, hydroxyalkyl alkylamines, polyalkylene amines, cyclic N-substituted amines and TMAH is used as the alkaline component.

Further, the alkaline etching solution may contain at least one component from the group of complexing agents, surfactants, stabilizers. A complexing agent from the group of hydroxyphenols, amine derivatives (chelating agents) such as nitrilotriacetic acid (NTA) or ethylenediaminetetraacetic acid (EDTA), hydroxycarboxylic acids, polyalcohols, phosphonic acids, polyphosphates are particularly considered as complexing agents. Citric acid or tartaric acid are considered as hydroxycarboxylic acids; glycerol, sorbitol and other sugars and sugar alcohols are considered as polyalcohols.

The time of contact between the surface of the semiconductor device and the alkaline etching solution should amount to 5 sec to 5 min, preferably 30 sec to 60 sec, at a temperature between room temperature and 60° C., preferably between 35° C. and 45° C.

With the use of an appropriate etching solution and particularly considering the above named parameters, the precipitates, which can be seen after the second temperature step without optimized parameters, are etched away, so that empty grooves result.

After the precipitates are etched away, the semiconductor device, thus the wafer, in particular, is subjected to a new T-t treatment without introducing a dopant source. In this case, the time is selected considerably longer than for the formation of the first dopant profile. In particular, a temperature between 750° C. and 1000° C. during a time between 10 min and 120 min, in particular between 20 min and 60 min should be effective for forming the second dopant profile. In contrast, the time for forming the first dopant profile amounts to between 0.5 min and 10 min, preferably between 1 min and 5 min. The temperature is usually selected in the same order of magnitude.

The phosphorus that has diffused into the substrate after the first T-t profile can then be driven very deeply into the semiconductor substrate during the second T-t profile. The depth depends on the temperature and time (second T-t profile).

If the process is selectively applied, i.e., that only, e.g., regions not covered by a mask are etched, in order to remove the $Si_xP_y$ or $Si_xP_yO_z$ phases or precipitates, the electrically inactive phosphorus and the free phosphorus, in order to then introduce a metallizing after removal of the mask from the previously covered regions, standard P profiles can be obtained, which can be contacted by screen printing with any commercial paste. In the interdigital region, the dopant profile has a smaller surface concentration and is defect-poor in the surface, since here, precipitates are avoided and thus defects do not limit the performance of solar cells.

The invention is therefore also characterized in that the $Si_xP_y$ phases, electrically inactive phosphorus and phosphorus that is not incorporated in the Si crystal lattice are removed, in particular with the application of an etch-resistant mask or an application in regions of an etching paste, exclusively in regions.

Optionally, the possibility also exists of removing the precipitates from the wafer surfaces with the indicated etching solutions after the complete diffusion step.

Independently from this, the invention is characterized in that the second dopant profile is formed in such a way that a phosphorus concentration between $1*10^{19}$ P/cm$^3$ and $5*10^{20}$ P/cm$^3$ results in the region in the vicinity of the surface down to a depth of 40 nm. In addition, by adjusting the temperature (T)-time (t) profile in the second temperature step (diffusion step), the depth of the profile can be varied, so that a phosphorus concentration of at least $1*10^{16}$ P/cm$^3$ results at a distance D, with D≅500 nm from the surface of the semiconductor device, as is shown, e.g., in FIG. 6.

In addition, it is indicated here that a solution containing phosphoric acid is preferably used as the dopant source. Optionally, however, a short POCl3 diffusion can also be used as the first process step.

The invention claimed is:

1. A method for forming a dopant profile proceeding from a surface of a plate-shaped or wafer-shaped silicon-based semiconductor device with phosphorus as a dopant, comprising:
    applying a phosphorus dopant source onto the surface;
    forming a first dopant profile with the phosphorus dopant source present on the surface;
    removing the phosphorus dopant source and precipitates present on the surface, the precipitates being selected from the group consisting of $Si_xP_y$, $Si_xP_yO_z$, and combinations thereof; and
    forming a second dopant profile having greater depth in comparison to the first dopant profile.

2. The method according to claim 1, wherein, after removal of the phosphorus dopant source and the precipitates present on the surface, the method further comprises removing electrically inactive phosphorus and free phosphorus.

3. The method according to claim 1, wherein, after forming the first dopant profile and removing the phosphorus dopant source, the method further comprises applying an etch-resistant mask on the surface, the mask having a geometry that corresponds to that of a metallizing to be applied on the surface.

4. The method according to claim 1, wherein the step of forming the first dopant profile comprises subjecting the semiconductor device to a first temperature ($T_1$) that is greater than or equal to 750° C. over a first time ($t_1$), during which a first phosphorus concentration (K) in phosphorus atoms/cm$^3$ of between $10^{16}$ and $10^{21}$ arises in the surface layer of the semiconductor device in a thickness region (D) between 80 nm and 120 nm, and a second phosphorus concentration ($K_o$) in phosphorus atoms/cm$^3$ of greater than $10^{20}$ arises in the region in the vicinity of the surface down to a second thickness ($D_o$) of between 0 nm and 50 nm.

5. The method according to claim 4, wherein the step of forming the second dopant profile comprises subjecting the semiconductor device to a second temperature ($T_2$) over a second time ($t_2$), whereby the second time ($t_2$) is greater than the first time ($t_1$).

6. The method according to claim 5, wherein the second temperature ($T_2$) is greater than or equal to the first temperature ($T_1$) with the second temperature being less than or equal to 1000° C.

7. The method according to claim 5, wherein the first time ($t_1$) is between 0.5 minutes and 10 minutes and the second time ($t_2$) is between 10 minutes and 180 minutes.

8. The method according to claim 5, wherein the step of removing the precipitates comprises applying an alkaline etching solution that contains an oxidizing agent, whereby the alkaline etching solution contacts the surface particularly during a third time ($t_3$) of between 5 seconds and 5 minutes at a temperature ($T_3$) of between 35° C. and 45° C.

9. The method according to claim 1, wherein the step of removing the precipitates comprises contacting surface with an alkaline etching solution containing at least one oxidizing agent selected from the group consisting of peroxodisulfates, peroxomonosulfates, hypochlorite, and hydrogen peroxide.

10. The method according to claim 8, wherein the alkaline component of the alkaline etching solution uses at least one component selected from the group consisting of NaOH, KOH, ammonia, ammonia derivatives, alkylamines, alkanolamines, hydroxyalkyl alkylamines, polyalkylene amines, cyclic N-substituted amines, and tetraalkylammoniumhydroxide.

11. The method according to claim 8, wherein the alkaline etching solution further comprises at least one component selected from the group consisting of complexing agents, surfactants, and stabilizers.

12. The method according to claim 8, wherein the alkaline etching solution further comprises a complexing agent selected from the group consisting of hydroxyphenols, amine derivatives, hydroxycarboxylic acids, polyalcohols, phosphonic acids, and polyphosphates.

13. The method according to claim 8 wherein the alkaline etching solution comprises a solution selected from the group consisting of a dilute hypochlorite solution of NaOH: 1 to 50 g/L, sodium hypochlorite solution containing 6 to 14% active chlorine, 150-750 mL/L, and KOH.

14. The method according to claim 8, wherein the alkaline etching solution comprises ammonium peroxodisulfate with, as an oxidizing agent, a composition comprising NaOH: 1 to 50 g/L, ammonium peroxodisulfate 5 to 350 g/L, and at least one component selected from the group consisting of KOH, ammonia, ammonia derivatives, amines as the alkaline component, peroxodisulfate salts, sodium peroxodisulfate, potassium peroxodisulfate, peroxomonosulfates, and potassium peroxomonosulfate.

15. The method according to claim 1, wherein the step of removing the precipitates further comprises etching a region in the vicinity of the surface to a thickness (d) of less than 10 nm.

16. The method according to claim 2, wherein the steps of removing the precipitates and removing the electrically inactive phosphorus and free phosphorus comprise applying an etch-resistant mask regionally or applying an etching paste regionally.

17. The method according to claim 1, wherein the second dopant profile is formed such that a phosphorus concentration between $1*10^{19}$ P/cm$^3$ and $5*10^{20}$ P/cm$^3$ results in the region of the semiconductor device in the vicinity of the surface down to a depth of 40 nm.

18. The method according to claim 1, wherein the phosphorus dopant source comprises a solution containing phosphoric acid.

19. The method according to claim 1, wherein the second dopant profile is formed in such a way that a phosphorus concentration of at least $1*10^{16}$ P/cm$^3$ results at a distance D of D≅500 nm from the surface of the semiconductor device.

20. The method according to claim 1, wherein the second dopant profile is formed in such a way that a phosphorus concentration between $1*10^{19}$ P/cm$^3$ and $5*10^{20}$ P/cm$^3$ results in the region of the semiconductor device in the vicinity of the surface down to a depth of 40 nm and that a phosphorus concentration of at least $1*10^{16}$ P/cm$^3$ results at a distance D of D≅500 nm from the surface of the semiconductor device.

* * * * *